(12) United States Patent
Thompson et al.

(10) Patent No.: US 8,083,302 B2
(45) Date of Patent: Dec. 27, 2011

(54) L-SHAPED DOORS WITH TRAPEZOIDAL SEAL

(75) Inventors: Kevin Thompson, Chaska, MN (US); Michael J. Wayman, Waconia, MN (US); Michael J. Nelson, Prior Lake, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 655 days.

(21) Appl. No.: 12/200,221

(22) Filed: Aug. 28, 2008

(65) Prior Publication Data
US 2009/0307984 A1 Dec. 17, 2009

Related U.S. Application Data

(60) Provisional application No. 61/060,576, filed on Jun. 11, 2008.

(51) Int. Cl.
A47B 96/00 (2006.01)
(52) U.S. Cl. ...................................... 312/296; 312/223.1
(58) Field of Classification Search .......... 312/326–329, 312/296, 223.1, 100, 236; 49/475.1, 483.1, 49/492.1; 277/644, 647, 645, 641, 637, 906, 277/920
See application file for complete search history.

(56) References Cited

U.S. PATENT DOCUMENTS

| | | | |
|---|---|---|---|
| 1,683,793 A * | 9/1928 | Nyman | 16/86 B |
| 2,226,615 A | 12/1940 | Killen | |
| 2,259,185 A * | 10/1941 | Swedman | 220/592.07 |
| 2,704,688 A | 3/1955 | Adell | |
| 2,723,896 A * | 11/1955 | Wurtz | 312/296 |
| 2,740,658 A | 4/1956 | Kesich | |
| 3,014,158 A * | 12/1961 | Nelson et al. | 361/41 |
| 3,126,589 A * | 3/1964 | Monti | 49/482.1 |
| 3,138,833 A * | 6/1964 | Neuman | 49/478.1 |
| 3,371,447 A | 3/1968 | Ruff | |
| 3,501,866 A * | 3/1970 | Johnson | 49/380 |
| 3,837,120 A * | 9/1974 | Hanks et al. | 49/489.1 |
| 3,894,767 A * | 7/1975 | Schatzler et al. | 296/213 |
| 4,114,065 A * | 9/1978 | Horvay | 312/406 |
| 4,820,885 A * | 4/1989 | Lindsay | 174/353 |
| 4,861,077 A | 8/1989 | Welkey | |
| 4,862,324 A * | 8/1989 | Kalvaitis et al. | 361/724 |
| 4,994,315 A * | 2/1991 | Schreiber et al. | 428/76 |
| 5,157,577 A | 10/1992 | Balaud | |
| 5,267,762 A | 12/1993 | Gromotka | |
| 5,274,731 A * | 12/1993 | White | 385/135 |
| 5,309,680 A * | 5/1994 | Kiel | 49/478.1 |
| 5,465,528 A * | 11/1995 | Schinzel et al. | 49/368 |
| 5,548,085 A * | 8/1996 | Flores | 174/374 |
| 5,710,804 A | 1/1998 | Bhame et al. | |
| 5,713,647 A | 2/1998 | Kim | |
| 5,905,244 A | 5/1999 | Smith | |
| 6,065,612 A | 5/2000 | Rinderer | |
| 6,082,441 A | 7/2000 | Boehmer et al. | |
| 6,116,615 A | 9/2000 | Trehan | |

(Continued)

*Primary Examiner* — Janet M Wilkens
(74) *Attorney, Agent, or Firm* — Fogg & Powers LLC

(57) ABSTRACT

A water-resistant and electromagnetic interference shielded enclosure configured to enclose at least one electronic module is provided. The water-resistant and electromagnetic interference shielded enclosure includes a base having a channel, a first L-shaped door rotatably attached to a first edge of the base, a second L-shaped door rotatably attached to a second edge of the base, a flange seal attached to a first flange on the first L-shaped door, and a compressible base-seal inserted into the channel. The compressible base-seal and the flange seal form an enclosure seal when the first L-shaped door and the second L-shaped door are closed.

16 Claims, 14 Drawing Sheets

U.S. PATENT DOCUMENTS

| | | | |
|---|---|---|---|
| 6,142,595 A | 11/2000 | Dellapi et al. | |
| 6,158,832 A * | 12/2000 | Costa et al. | 312/326 |
| 6,229,707 B1 | 5/2001 | Keenan | |
| 6,238,027 B1 | 5/2001 | Kohler et al. | |
| 6,299,008 B1 | 10/2001 | Payne | |
| 6,350,000 B1 * | 2/2002 | Van Benthem et al. | 312/236 |
| 6,384,323 B2 * | 5/2002 | Elm et al. | 174/374 |
| 6,452,810 B1 | 9/2002 | Wilcox | |
| 6,469,911 B1 | 10/2002 | Brown et al. | |
| 6,512,669 B1 | 1/2003 | Goodwin | |
| 6,564,428 B2 * | 5/2003 | Richard et al. | 16/366 |
| 6,621,712 B2 | 9/2003 | Siira | |
| 6,788,535 B2 | 9/2004 | Dodgen | |
| 6,968,647 B2 | 11/2005 | Levesque et al. | |
| 7,068,516 B2 | 6/2006 | Chan | |
| 7,225,586 B2 | 6/2007 | Levesque et al. | |
| 7,450,382 B1 | 11/2008 | Fischer | |
| 7,495,169 B2 | 2/2009 | Adducci | |
| 2002/0125799 A1 * | 9/2002 | Landsberger et al. | 312/209 |
| 2002/0130598 A1 * | 9/2002 | Schmidt | 312/324 |
| 2003/0016515 A1 | 1/2003 | Jackson | |
| 2003/0031002 A1 | 2/2003 | Siira | |
| 2003/0099101 A1 * | 5/2003 | Skrepcinski et al. | 361/796 |
| 2003/0102141 A1 * | 6/2003 | Schneider et al. | 174/50 |
| 2004/0114326 A1 * | 6/2004 | Dodgen et al. | 361/694 |
| 2006/0158866 A1 | 7/2006 | Peterson | |
| 2007/0247809 A1 | 10/2007 | McClure | |
| 2008/0031585 A1 * | 2/2008 | Solheid et al. | 385/135 |
| 2008/0318631 A1 | 12/2008 | Baldwin | |
| 2009/0102140 A1 * | 4/2009 | Deaver | 277/644 |
| 2009/0307983 A1 * | 12/2009 | Nelson et al. | 49/479.1 |
| 2009/0309467 A1 * | 12/2009 | Nelson et al. | 312/223.1 |

* cited by examiner

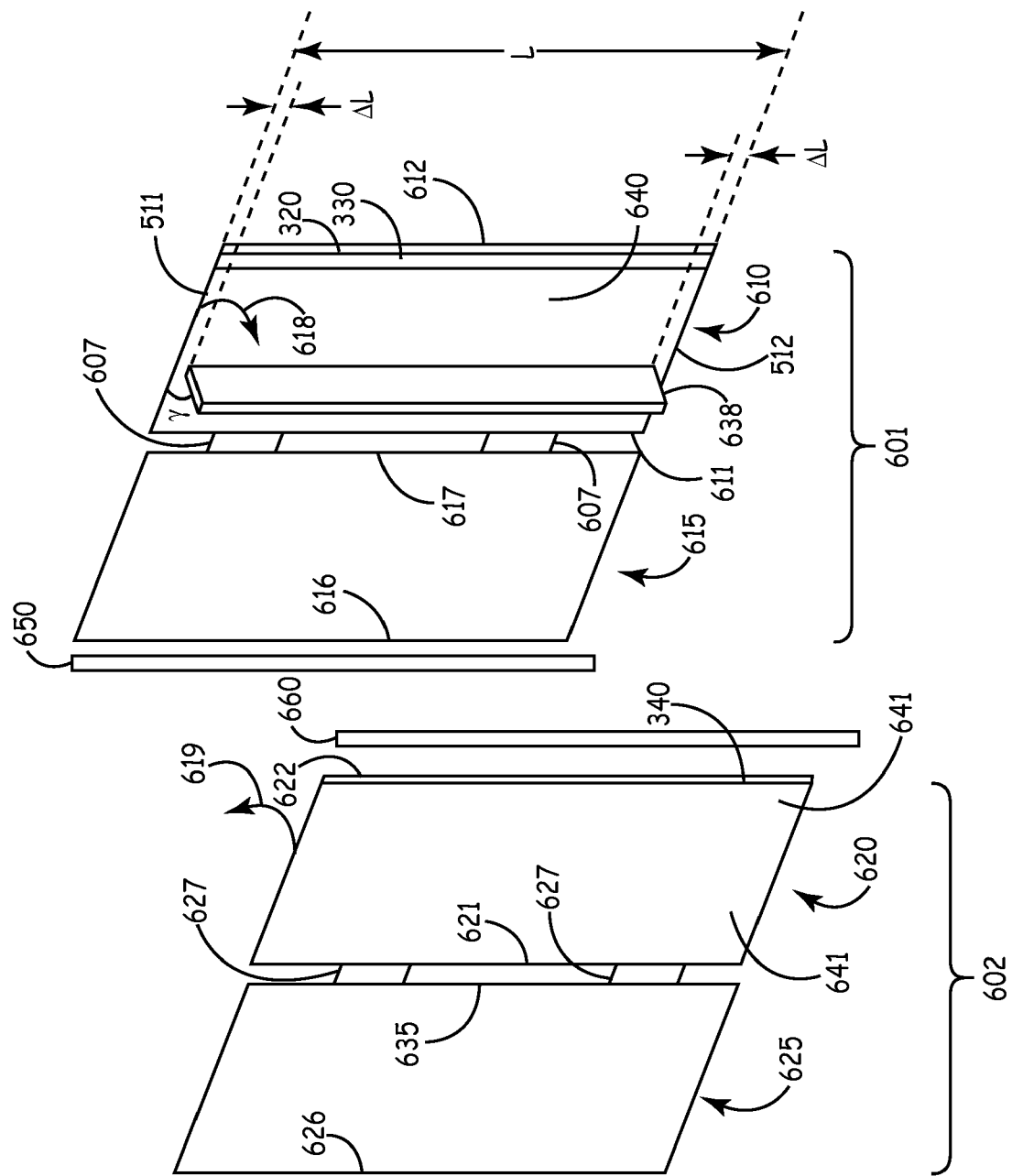

US 8,083,302 B2

L-SHAPED DOORS WITH TRAPEZOIDAL SEAL

CROSS REFERENCE TO RELATED APPLICATIONS

This application claims priority to U.S. Provisional Application No. 61/060,576 filed on Jun. 11, 2008, which is incorporated herein by reference in its entirety.

This application is related to the following co-pending United States patent applications filed on even date with the U.S. Provisional Application No. 61/060,576, all of which are hereby incorporated herein by reference:

U.S. patent application Ser. No. 12/137,322, titled "COMMUNICATION MODULES" and which is referred to here as the '322 Application;

U.S. patent application Ser. No. 12/137,297, titled "APPARATUS FOR MOUNTING A MODULE AND ENABLING HEAT CONDUCTION FROM THE MODULE TO THE MOUNTING SURFACE" and which is referred to here as the '297 Application;

U.S. patent application Ser. No. 61/060,589, titled "SUSPENSION METHOD FOR COMPLIANT THERMAL CONTACT OF ELECTRONIC MODULES" and which is referred to here as the '589 Application;

U.S. patent application Ser. No. 12/137,307, titled "ANGLED DOORS WITH CONTINUOUS SEAL" and which is referred to here as the '307 Application;

U.S. patent application Ser. No. 61/060,523, titled "L-SHAPED DOOR WITH 3-SURFACE SEAL FOR END-PLATES" and which is referred to here as the '523 Application;

U.S. patent application Ser. No. 12/137,309, titled "SYSTEMS AND METHODS FOR VENTURI FAN-ASSISTED COOLING" and which is referred to here as the '309 Application;

U.S. patent application Ser. No. 61/060,547, titled "COMBINATION EXTRUDED AND CAST METAL OUTDOOR ELECTRONICS ENCLOSURE" and which is referred to here as the '547 Application;

U.S. patent application Ser. No. 61/060,584, titled "SYSTEMS AND METHODS FOR CABLE MANAGEMENT" and which is referred to here as the '584 Application;

U.S. patent application Ser. No. 61/060,581, titled "CAM SHAPED HINGES" and which is referred to here as the '581 Application;

U.S. patent application Ser. No. 12/137,313, titled "SOLAR SHIELDS" and which is referred to here as the '313 Application;

U.S. patent application Ser. No. 61/060,501, titled "APPARATUS AND METHOD FOR BLIND SLOTS FOR SELF DRILLING/SELF-TAPPING SCREWS" and which is referred to here as the '501 Application;

U.S. patent application Ser. No. 61/060,593, titled "SYSTEMS AND METHODS FOR THERMAL MANAGEMENT" and which is referred to here as the '593 Application;

U.S. patent application Ser. 61/060,762, titled "SERF BOARD COMPONENTS" and which is referred to here as the '762 Application; and U.S. patent application Ser. No. 61/060,740 entitled "PULL-OUT SHELF FOR USE IN A CONFINED SPACE FORMED IN A STRUCTURE" and which is referred to here as the '740 Application.

BACKGROUND

In a communications system, such as a distributed antenna system and/or telecommunications infrastructure equipment, it is often necessary to place a remote unit in an outdoor area. For example, a remote unit may be placed in an outdoor stadium, park, etc. In some distributed antenna system deployments, the remote antennas are installed on a utility pole or other urban street furniture such as bus shelters, traffic control signals, mail boxes or other structures. Placing a remote unit outdoors potentially exposes the unit to adverse weather conditions, such as rain, wind, etc. In order to protect the electronic modules and/or electronic components of the remote unit, the electronic modules are typically placed in an enclosure which is water-resistant. While enclosures protect the electronic modules, conventional enclosures also make it difficult to access the components during installation or maintenance by blocking or providing small access areas to one or more sides of the electronic modules.

In some cases, the telecommunications infrastructure equipment, which is housed in the outdoor electronic enclosures, emit electromagnetic fields that can cause electromagnetic interference (EMI) with electronic devices external to the outdoor electronic enclosures.

SUMMARY

In one embodiment, the present application relates to a water-resistant and electromagnetic interference shielded enclosure configured to enclose a plurality of electronic modules. The water-resistant and electromagnetic interference shielded enclosure includes a base having a channel, a first L-shaped door rotatably attached to a first edge of the base, a second L-shaped door rotatably attached to a second edge of the base, a flange seal attached to a first flange on the first L-shaped door, and a compressible base-seal inserted into the channel. The compressible base-seal and the flange seal form an enclosure seal when the first L-shaped door and the second L-shaped door are closed.

In another embodiment, the present application relates to a method to form a water resistant and electromagnetic interference shielded seal on an enclosure. The method includes attaching a first L-shaped door by a hinge to a first edge of a back wall of a base, attaching a second L-shaped door by a hinge to a second edge of the back wall of the base, the second edge opposing the first edge, inserting a compressible base-seal into a channel that extends along an exposed perimeter of the base, attaching a flange seal to a first flange on the first L-shaped door, and forming an enclosure seal with the first L-shaped door, the second L-shaped door, the compressible base-seal, and the flange seal.

In yet another embodiment, the present application relates to a water-resistant and electromagnetic interference shielded enclosure configured to enclose at least one electronic module. The enclosure includes a base having a channel that extends along an exposed perimeter of the base, an L-shaped door rotatably attached to a first edge of the base, a trapezoidal seal attached to a flange on the door, and a compressible base-seal inserted into the channel. The compressible base-seal and the trapezoidal seal form an enclosure seal for the enclosure when the door is closed.

DRAWINGS

FIGS. 9A-9B show an embodiment of panels for a first and a second configurable-door in accordance with the present invention.

In accordance with common practice, the various described features are not drawn to scale but are drawn to emphasize features relevant to the present invention. Like reference characters denote like elements throughout figures and text.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

For the reasons stated above and for other reasons stated below which will become apparent to those skilled in the art upon reading and understanding the specification, there is a need in the art for improved systems and methods that permit easy access to electronic equipment housed in water-resistant outdoor electronic enclosures and that prevent leakage of interfering electromagnetic fields from the electronic equipment housed in the outdoor electronic enclosure.

Figure 1:
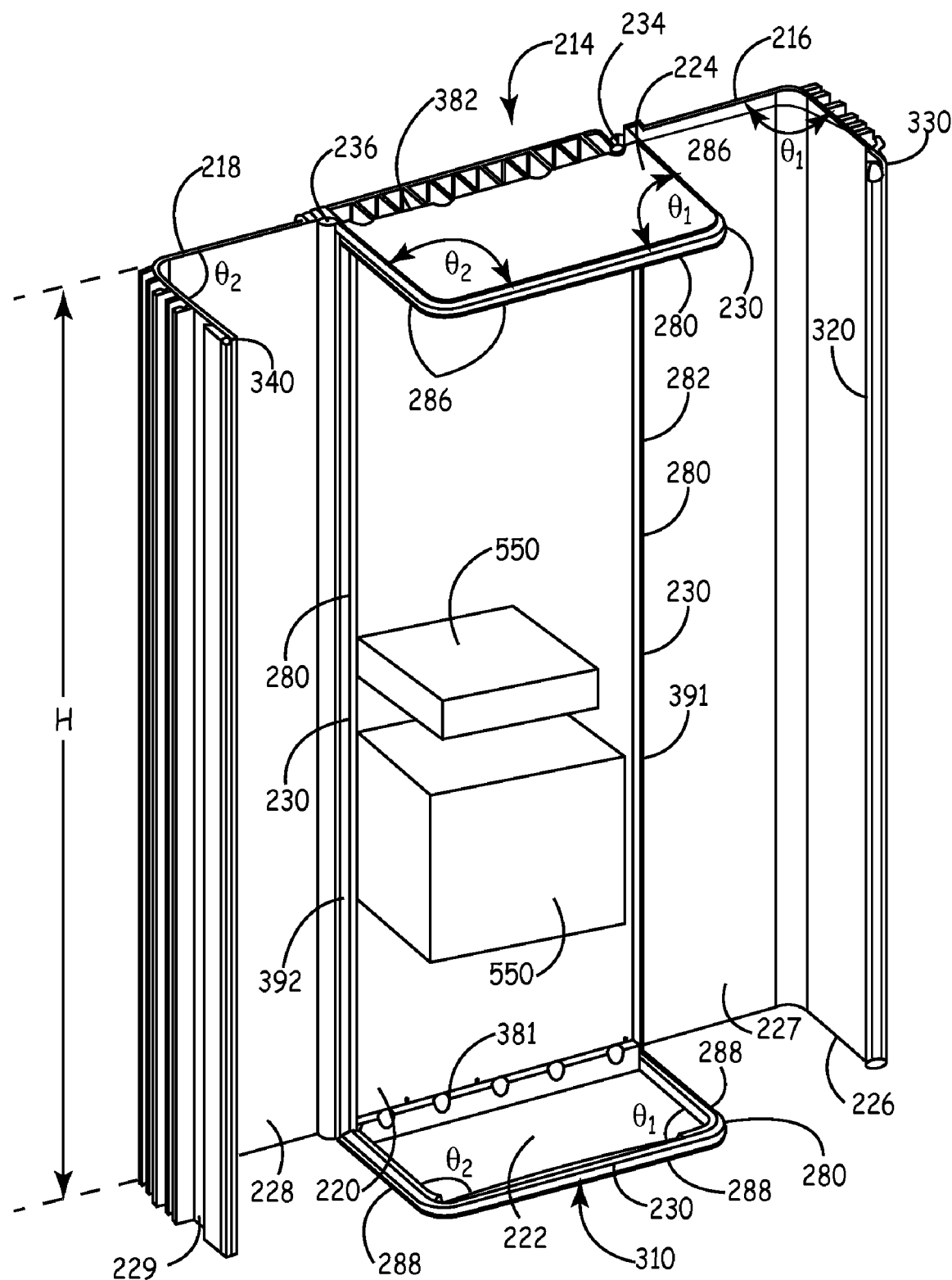
FIG. 1 is an oblique view of one embodiment of a first L-shaped door and a second L-shaped door attached to a base in an open position in accordance with the present invention.

FIG. 1 is an oblique view of one embodiment of a first L-shaped door 216 and a second L-shaped door 218 attached to a base 214 in an open position in accordance with the present invention. The base 214 includes a back wall 220, a first endplate 224, and a second endplate 222. The first L-shaped door 216 includes a section 226 and a section 227 that form an approximately 90 degree angle (represented generally at $\theta_1$) to match the approximately 90 degree angle of the rectangular shape of the second endplate 222 and first endplate 224. Likewise, the second L-shaped door 218 includes a section 228 and a section 229 that form an approximately 90 degree angle (represented generally at $\theta_2$) to match the approximately 90 degree angle of the rectangular shape of the second endplate 222 and first endplate 224. The first L-shaped door 216 is rotatably attached by hinge 234 to the base 214. The second L-shaped door 218 is rotatably attached by a hinge 236 the base 214. In one implementation of this embodiment, the hinges 234 and 236 are cam shaped hinges, such as the cam shaped hinges described in the '581 Application that is incorporated herein by reference.

The back wall 220 has a first short edge 381 and a second short edge 382 opposing the first short edge 381, a first long edge 391, and a second long edge 392 opposing the first long edge 391. A first endplate 224 is attached to the first short edge 381 of the back wall 220. The first endplate 224 has an edge 286 that does not abut the back wall 220. A second endplate 222 is attached to the second short edge 382 of the back wall. The second endplate 222 has an edge 288 that does not abut the back wall 220. In one implementation of this embodiment, the first short edge 381 and the second short edge 382 are both equal in length to the first long edge 391 and the second long edge 392. In this case, the back wall 220 has the shape of a square.

A perimeter 280 of base 214 is completely exposed when the first L-shaped door and the second L-shaped door attached to the base 214 are in an open position as shown in FIG. 1. As defined herein, an "exposed perimeter 280" of base 214 refers to the section of the back wall 220 that is next to the first long edge 391 of back wall 220, the section of the back wall 220 that is next to the second long edge 392 of back wall 220, the edge 288 of second endplate 222 that does not abut the back wall 220, and the edge 286 of the first endplate 224 that does not abut the back wall 200. A continuous channel 230 is formed in the exposed perimeter 280. The continuous channel 230 runs continuously along the section of the back wall 220 next to the first long edge 391, to the edge 286 of the first endplate 224, to the section of the back wall 220 next to the second long edge 392 of the base 214, on to the edge 288 of the second endplate 222 and back to the section of the back wall 220 next to the first long edge 391. Thus, the base 214 includes a channel 230, which extends along the exposed perimeter 280 of base 214.

The first L-shaped door 216 and second L-shaped door 218 are configured to abut the exposed perimeter 280 of base 214 in order to form a sealed, water-resistant enclosure having a flange seal 320. The flange seal 320 is formed from a compressible material that is shaped to fit on a flange 330, also referred to herein as "first flange 330," on the first L-shaped door 216. A trapezoidal shaped flange seal 320 is attached to the first flange 330 on the first L-shaped door 216. In embodiments in which the flange seal 320 has a trapezoidal shape, the flange seal 320 is referred to as a "trapezoidal seal 320." The first flange 330 is a lip or protrusion having at least one lip at the edge of the first L-shaped door 216. The first flange 330 extends the height H of the first L-shaped door 216. The flange 340, also referred to herein as "second flange 340," is a lip at the edge of the second L-shaped door 218. The second flange 340 extends the height H of the second L-shaped door 218. As defined herein, the flange seal 320 is a seal or gasket operable to prevent a joint from leaking water.

The continuous channel 230 is configured to hold a compressible base-seal 300. As defined herein, the compressible base-seal 300 is a seal or gasket operable to prevent a joint from leaking that is formed from a compressible material and that is shaped to fit into the channel 230, either as a single piece or a plurality of pieces. The compressible base-seal 300 and the flange seal 320 form an enclosure seal (see FIG. 5) when the first L-shaped door 216 and the second L-shaped door 218 are closed.

In one implementation of this embodiment, the compressible base-seal 300 is a continuous compressible base-seal 300 without any breaks along the length of the compressible base-seal 300. In another implementation of this embodiment, the compressible base-seal 300 is an O-ring. In another implementation of this embodiment, the compressible base-seal 300 is a C-shaped seal. In other implementations of this embodiment, the compressible base seal can be a die cut foam, a solid piece having a circular cross section, a solid piece having a D-shaped cross section, a hollow piece having an annular cross section, a foam piece having a circular cross section, a foam piece having a D-shaped cross section, and combinations thereof.

As shown in FIG. 1, electronic modules 550 are attached to the back wall 220 of the base 214. In one implementation of this embodiment, the electronic modules 550 are communication modules, such as the communication modules described with reference to the '322 Application incorporated herein. The electronic modules 550 can be other electronic components.

Figure 2:
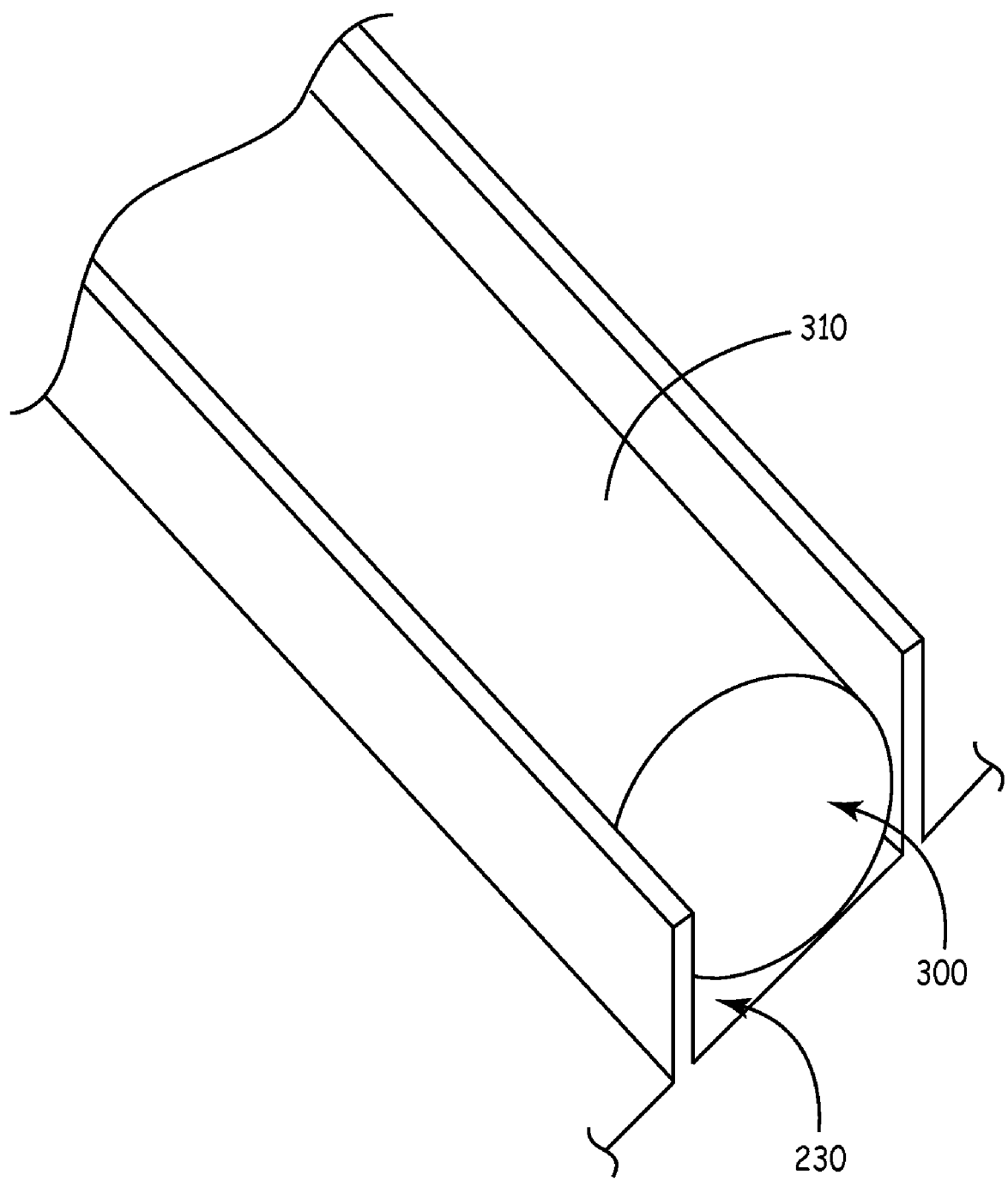
FIG. 2 is an enlarged cross-sectional view of a compressible base-seal in a channel in accordance with the present invention.

FIG. 2 is an enlarged cross-sectional view of a compressible base-seal 300 in the channel 230 in accordance with the present invention. The surface 310 of the compressible seal 300 is compressed by portions of the first L-shaped door 216 and the second L-shaped door 218 when the first L-shaped door 216 and the second L-shaped door 218 are closed to form an enclosure.

Figure 3:
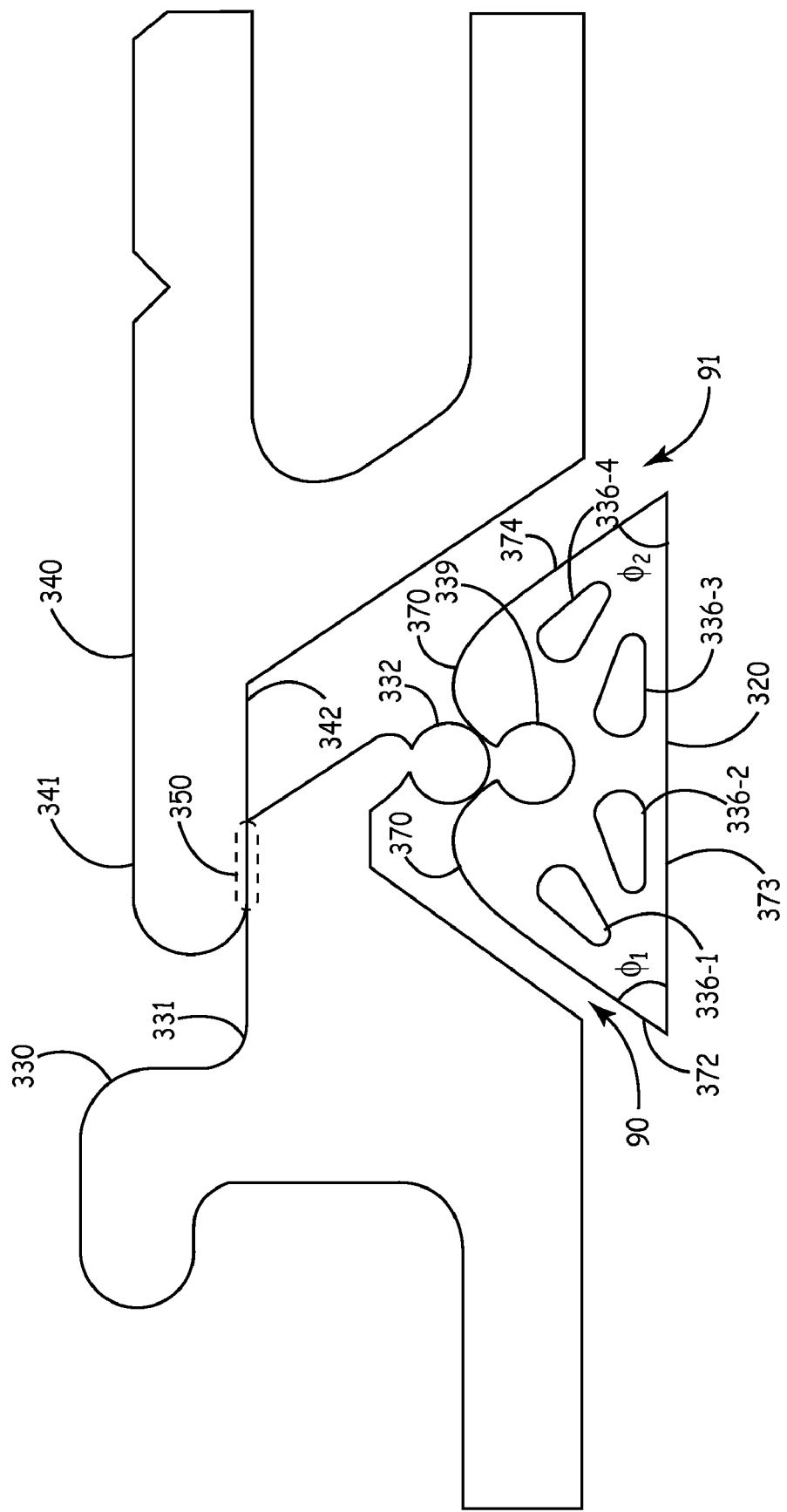
FIG. 3 is an end view of one embodiment of a trapezoidal seal in proximity to a flange on the first L-shaped door and a flange on the second L-shaped door in accordance with the present invention.
Figure 4:
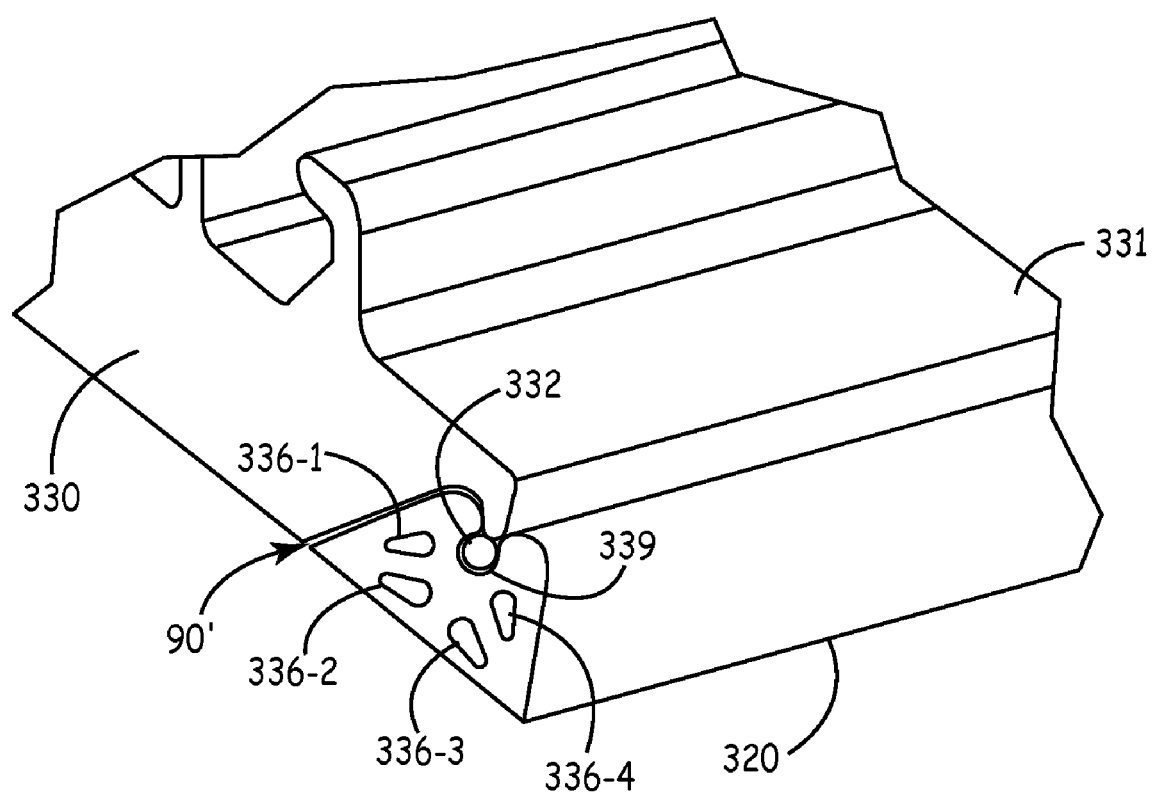
FIG. 4 is an enlarged oblique view of the trapezoidal seal of FIG. 3 attached to a rod-portion of the first flange on the first L-shaped door.

FIG. 3 is an end view of one embodiment of a trapezoidal seal 320 in proximity to a first flange 330 on the first L-shaped door 216 and a second flange 340 on the second L-shaped door 218 in accordance with the present invention. FIG. 4 is an enlarged oblique view of the trapezoidal seal 320 of FIG. 3 attached to a rod-portion 332 of the first flange 330 on the first L-shaped door 216.

When the first L-shaped door 216 and the second L-shaped door 218 are closed, the second flange 340 overlaps a portion of the first flange 330 so the first flange 330 is positioned between the second flange 340 and the trapezoidal seal 320. In this case, the trapezoidal seal 320 is positioned between a portion of the first flange 330 and a respective portion of the edge 286 of the first endplate 224 (FIG. 1), while another portion of the trapezoidal seal 320 is positioned between another portion of the first flange 330 and a respective other portion of the edge 288 of the second endplate 222 (FIG. 1).

The trapezoidal seal 320 includes a cylindrical cavity 339 on a first surface 370 of the trapezoidal seal 320 to accept the rod portion 332 of the first flange 330. The trapezoidal seal 320 also includes at least one hole, such as holes 336(1-4) that each extend a length H (FIG. 1) of the trapezoidal seal 320. A first acute angle $\phi_1$ is subtended between a second surface 372 and a third surface 373 (also referred to herein as "inner surface 373") of the trapezoidal seal 320. A second acute angle $\phi_2$ is subtended between the third surface 373 and a fourth surface 374 of the trapezoidal seal 320. When the first L-shaped door 216 and the second L-shaped door 28 are closed, a portion of the first flange 330 of the first L-shaped door 216 is positioned between the second flange 340 on the second L-shaped door 218 and the trapezoidal seal 320.

The second flange 340 on the second L-shaped door 218 overlaps the first flange 330 on the first L-shaped door 216 at the interface represented generally at 350 (FIG. 3) when the second L-shaped door 218 and the first L-shaped door 216 are in the closed position. The first flange 330 has an outer surface 331 that faces away from the back wall 220 (FIG. 1) of the base 214 when the first L-shaped door 216 is in the closed position. The second flange 340 has an outer surface 341 that faces away from the back wall 220 (FIG. 1) of the base 214 when the second L-shaped door 218 is in the closed position. The second flange 340 also has an inner surface 342 that opposes the outer surface 341. At the interface 350, the inner surface 342 of the second flange 340 is in contact with the outer surface 331 of the first flange 330.

The trapezoidal seal 320 has an inner surface 373 that is approximately flat. The trapezoidal seal 320 has a length H, which is equal to the height H (FIG. 1) of the first L-shaped door 216. The trapezoidal seal 320 includes four holes 336 (1-4) and a cylindrical cavity 339. As shown in FIG. 3, the four holes 336(1-4) have a cross-sectional tear-drop shape and the cylindrical cavity 339 has a cross-sectional circular shape. The four holes 336(1-4) and the cylindrical cavity 339 each extend the complete length H of trapezoidal seal 320. Other cross-sectional shapes for the holes 336(1-4) are possible. In one implementation of this embodiment, more than four holes 336 extend the length H of the trapezoidal seal 320. In one implementation of this embodiment, one or more holes 336 extend the length H of the trapezoidal seal 320.

The cross-section of the rod-portion 332 of the first flange 330 is circular and is configured to fit securely within the cylindrical cavity 339 of the trapezoidal seal 320. For example, the cylindrical cavity 339 of the trapezoidal seal 320 can be snapped onto the rod-portion 332 of the first flange 330. Once the cylindrical cavity 339 of the trapezoidal seal 320 is snapped onto the rod-portion 332 of the first flange 330, the trapezoidal seal 320 is securely fastened to the first flange 330. As shown in FIG. 4, the rod-portion 332 of the first flange 330 is inserted into the cylindrical cavity 339.

The cavities 90 and 91 (FIG. 3) are reduced when the rod-portion 332 of the first flange 330 is inserted into the cylindrical cavity 339 (see cavity 90' in FIG. 4). The shape of the holes 336(1-4) is designed to fill the cavity 91' (FIG. 4) between the second surface 372 and the first flange 330 and to simultaneously fill the cavity between the fourth surface 374 and the second flange 340 when the trapezoidal seal 320 is implemented as described below. The cavity 90' (FIG. 4) between the first flange 330 and the trapezoidal seal 320 is reduced to a narrower cavity 90" (FIG. 6) when the first and second L-shaped doors 216 and 218 are closed. In one implementation of this embodiment, the cavities 90" and 91" are completely filled.

Figure 5:
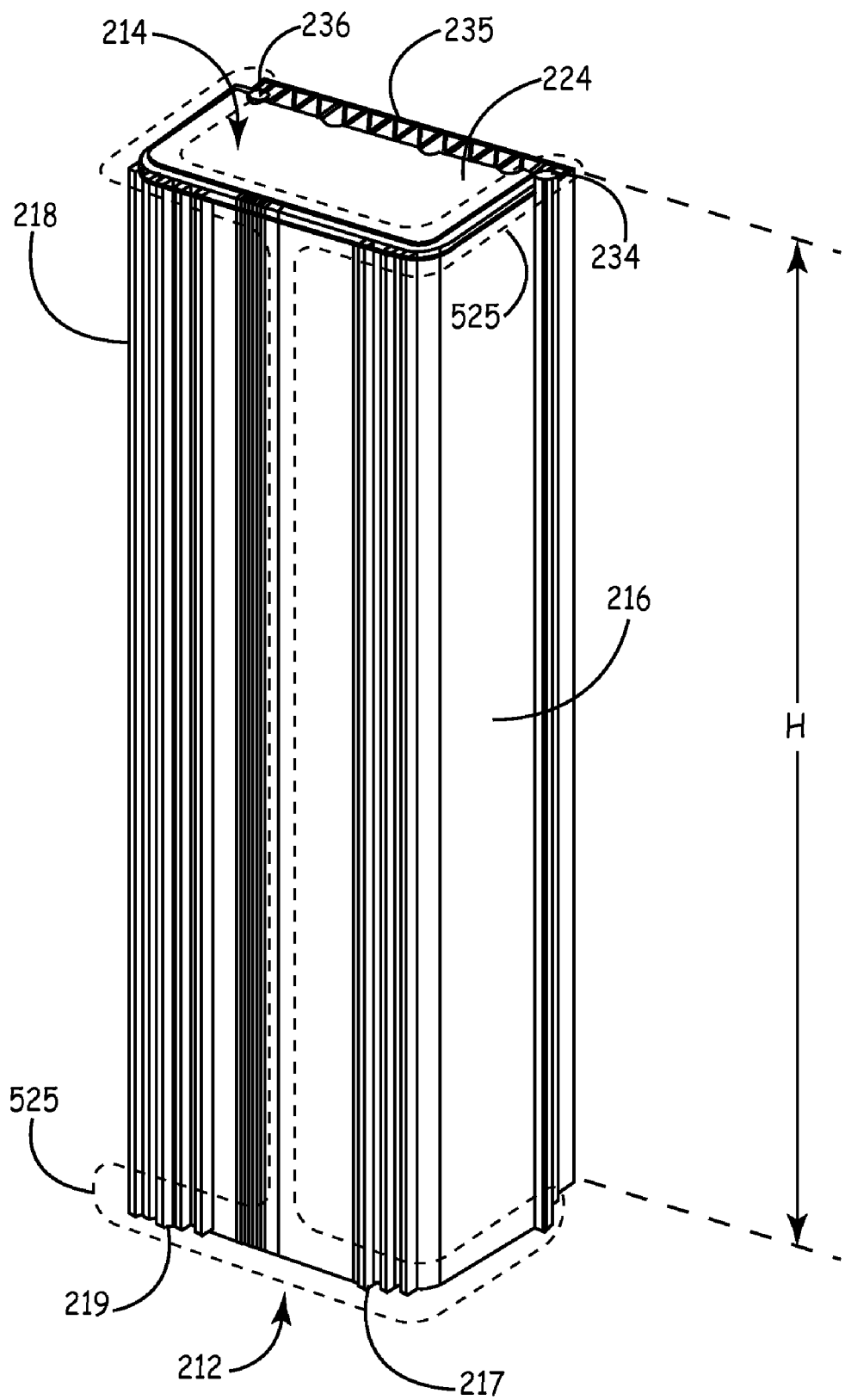
FIG. 5 is an oblique view of one embodiment of a first L-shaped door and a second L-shaped door attached to a base in a closed position in accordance with the present invention.

FIG. 5 is an oblique view of one embodiment of a first L-shaped door 216 and a second L-shaped door 218 attached to a base 214 in a closed position in accordance with the present invention. When the first L-shaped door 216 and the second L-shaped door 218 are closed, the first L-shaped door 216, the second L-shaped door 218, and the base 214 form a water-resistant and electromagnetic interference (EMI) shielded enclosure 212 (also referred to herein as enclosure 212) for the electronic modules 550 (FIG. 1) enclosed therein. The electronic modules 550 can be communication modules or electronic components. In one implementation of this embodiment, the enclosure 212 encloses a plurality of communication modules, such as the communication modules described with reference to the '322 Application incorporated herein.

When the first L-shaped door 216 and second L-shaped door 218 are closed, the continuous compressible base-seal 300 (FIG. 2) inserted in channel 230 (FIGS. 1 and 2) is compressed between the base 214, the first L-shaped door 216, and the second L-shaped door 218. Likewise, when the first L-shaped door 216 and second L-shaped door 218 are closed, the trapezoidal seal 320 is compressed between a portion of the first flange 330, a portion of the second flange 340, and the edge 286 (FIG. 1) of first endplate 224. Additionally, when the first L-shaped door 216 and second L-shaped door 218 are closed, the trapezoidal seal 320 is compressed between a portion of the first flange 330, a portion of the second flange 340, and the edge 288 of the second endplate 222.

In this manner, an enclosure seal represented generally at 525 is formed with the first L-shaped door 216, the second L-shaped door 218, the compressible base-seal 230, and the flange seal 320. As defined herein the enclosure seal functions to prevent moisture and electromagnetic fields from entering or leaving the water-resistant and electromagnetic interference shielded enclosure 212 when the enclosure 212 is in the closed configuration.

In one implementation of this embodiment, when the first L-shaped door 216 and second L-shaped door 218 are closed, the trapezoidal seal 320 is also compressed between the a portion of the first flange 330, a portion of the second flange 340, and at least one of the electronic modules 550 (FIG. 1) within the enclosure 212. Such an embodiment is shown in FIG. 6.

Figure 6:
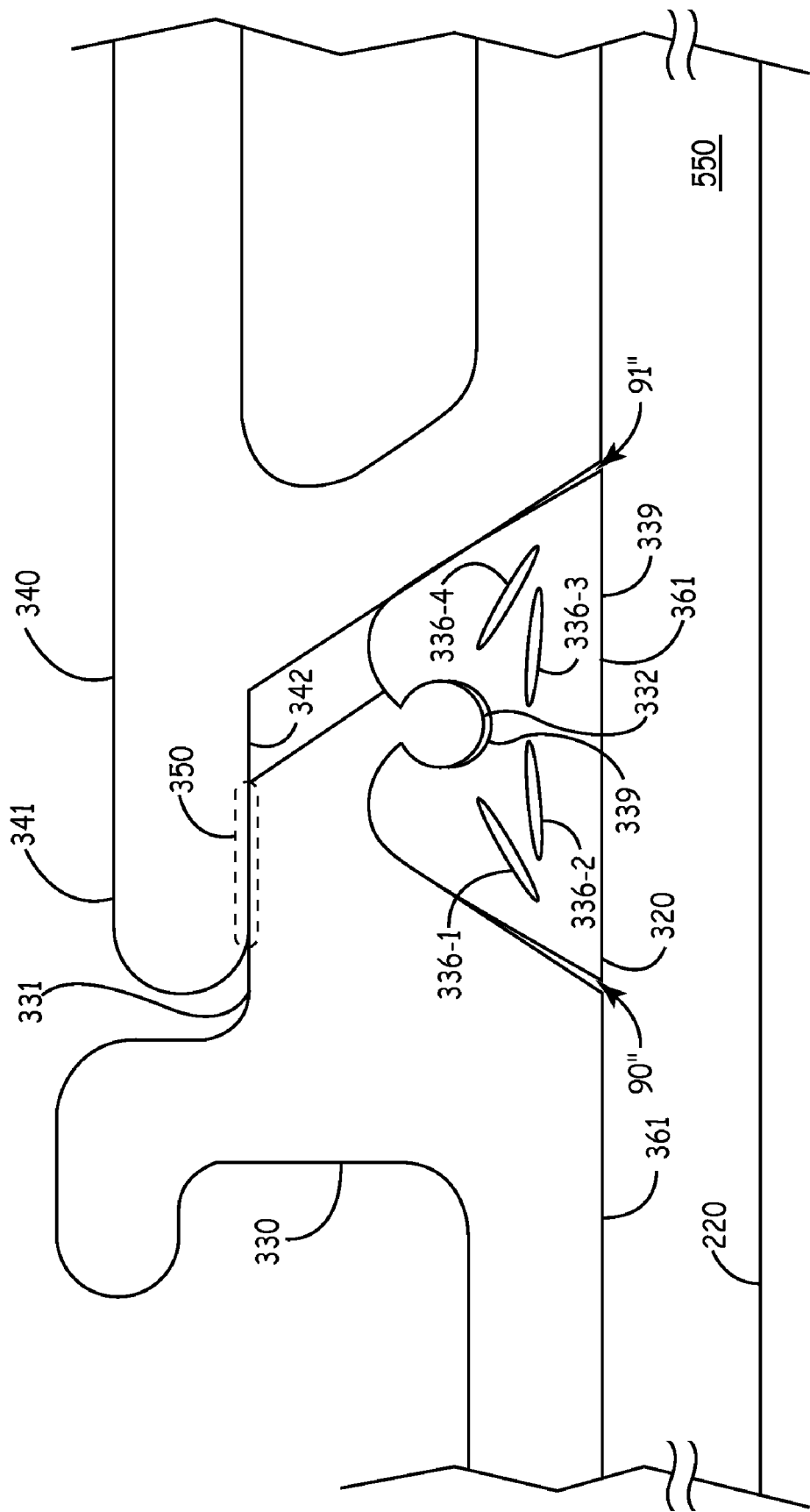
FIG. 6 is an enlarged end view of the trapezoidal seal in contact with an electronic module within an enclosure in accordance with the present invention.

FIG. 6 is an enlarged end view of the trapezoidal seal 320 in contact with an electronic module 550 within an enclosure 212 (FIG. 5) in accordance with the present invention. The holes 336(1-4) are distorted from their original cross-sectional tear-drop shape due to the compression of the trapezoidal seal 320 by a portion of the first flange 330, a portion of the second flange 340, and a surface 361 of the electronic module 550. A gap has been shown between the rod-portion 332 of the first flange 330 and the cylindrical cavity 339, for ease of viewing and understanding FIG. 6, however, it is likely that this gap would be filled when the trapezoidal seal 320 is compressed as shown in FIG. 6. Likewise, gaps 90" and 91" are shown for ease of viewing and understanding FIG. 6, however gaps 90" and 9" are likely to be filled when the trapezoidal seal 320 is compressed as shown in FIG. 6.

The trapezoidal seal 320 and the continuous compressible base-seal 300 function to provide a water-resistant seal for the enclosure 212 (FIG. 5), so that the contents of enclosure 212 (such as, electronic modules 550) remain dry in weather conditions including but not limited to wind and rain. Water is unable to leak through the sealant-filled enclosure seal 525 (FIG. 5). The overlap of the second flange 340 on the first flange 330 eliminates a direct path in the seam between first L-shaped door 216 and second L-shaped door 218 through which electromagnetic radiation can travel. By eliminating the direct path, EMI shielding is improved since the electromagnetic radiation, which can easily leak through a narrow slot, cannot as easily leak through a slot formed by overlapping flanges.

For the embodiments illustrated herein, the first L-shaped door 216 is rotated into a closed positioned against the base 214 before the second L-shaped door 218 is rotated into the closed positioned against the base 214. This ensures that the second flange 340 overlays the first flange 330 at the interface 350 (FIG. 3).

Figure 7:
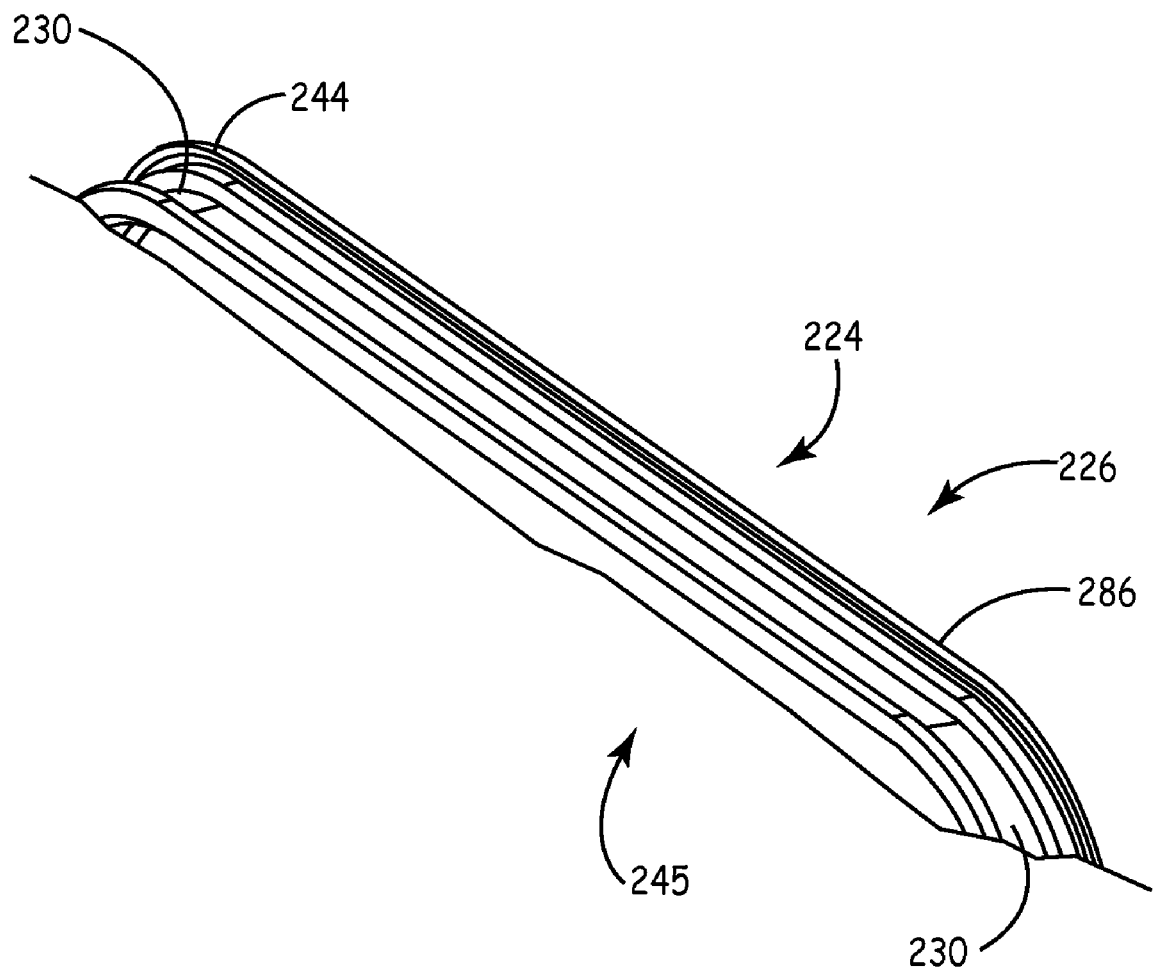
FIG. 7 is an enlarged view of one embodiment of an edge portion of endplates configured to reduce electromagnetic interference in accordance with the present invention.

In one implementation of this embodiment, the first endplate 224 and the second endplate 222 are configured to reduce leaking of electromagnetic radiation from the top and the bottom of the enclosure 212. FIG. 7 is an enlarged view of one embodiment of an edge portion 245 of endplates configured to reduce electromagnetic interference in accordance with the present invention. The enlarged view of the exemplary edge portion 245 of the first endplate 224 and second endplate 222 is shown as the same structure since they are similar in structure and function. The edge portion 245 includes the channel 230 (shown without the compressible base-seal 300 for clarity of the drawing) and a drip cap 244. The drip cap 244 is an outer ridge, which extends to the side of first L-shaped door 216 and second L-shaped door 218 when enclosure 212 (FIG. 5) is in the closed position. Drip cap 244, thus, provides additional protection against rain water by covering the seam between base 214 and first L-shaped door 216 and second L-shaped door 218. In addition, drip cap 244 improves EMI shielding by covering with metal the seam between the first and second endplates 224 and 222 and first L-shaped door 216 and second L-shaped door 218. In this way, there is no direct line for electromagnetic radiation to travel through the seam which results in improved EMI shielding.

Referring to FIG. 5, when the first L-shaped door 216 and the second L-shaped door 218 are formed from a thermally conductive material, the first L-shaped door 216 and second L-shaped door 218 can include heat sink fins, represented generally at 217 and 219, respectively. In addition, if the back wall 220 of the base 214 is formed from a thermo-conductive material, it can include heat sink fins represented generally at 235.

The continuous compressible base-seal 300 and the trapezoidal seal 320 are comprised of any appropriate material for providing a water-resistant seal or better. For example, in one embodiment, the continuous compressible base-seal 300 and the trapezoidal seal 320 are comprised of an open cell foam, such as silicone foam. In another implementation of this embodiment, the continuous compressible base-seal 300 and the trapezoidal seal 320 are comprised of a closed cell material. In yet another implementation of this embodiment, the continuous compressible base-seal 300 and the trapezoidal seal 320 are comprised of a modified closed cell material. In yet another implementation of this embodiment, the continuous compressible base-seal 300 and the trapezoidal seal 320 are comprised of a solid rubber like material. In yet another implementation of this embodiment, the continuous compressible base-seal 300 is comprised of separate pieces which are bonded together to form one continuous seal. In another implementation of this embodiment, the continuous compressible base-seal 300 is manufactured as one continuous piece. In yet another implementation of this embodiment, the continuous compressible base-seal 300 has a circular cross-section as shown in FIG. 2. In yet another implementation of this embodiment, continuous compressible base-seal 300 has a rectangular cross-section.

In some embodiments, back wall 220, first endplate 224, and second endplate 222 are manufactured as separate segments, which are then coupled together to form base 214.

In other embodiments, back wall 220, the first L-shaped door 216 and the second L-shaped door 218 are each manufactured as one continuous segment. Base 214, the first L-shaped door 216, and the second L-shaped door 218 are comprised of any appropriate material for outdoor weather conditions including, but not limited to, plastics and metal. In particular, in this embodiment, base 214, the first L-shaped door 216, and the second L-shaped door 218 are comprised of aluminum. In addition, base 214, the first L-shaped door 216, and/or the second L-shaped door 218 are manufactured, in some embodiments, through an extrusion process. Extruding base 214, the first L-shaped door 216, and the second L-shaped door 218 enables the walls and base to be manufactured with varying lengths based on the needs of customers. In this case, the first and second L-shaped doors 216 and 218 can be cut to a desired length, H, so that the height H of the enclosure 212 is sufficient to house all the required electronic modules 550 while minimizing the volume of the enclosure 212. Likewise the back wall 220 can be extruded and cut to length to match the length, H, of the first and second L-shaped doors 216 and 218. In this case, the first and second endplates 224 and 222 can be attached to the cut-to-length back wall 220. In one implementation of this embodiment, the extrusion processes as described in the '547 application are used manufacture the first and second L-shaped doors 216 and 218 and the back wall 220. In other embodiments, however, other manufacturing processes, such as die casting, are used to manufacture base 214, the first L-shaped door 216, and/or the second L-shaped door 218.

It is to be understood that embodiments of the present invention are not to be limited to L-shaped doors but can be V-shaped doors. For example, other angular aspects are possible between the section 226 and a section 227. For example, an exemplary $\phi_1$ degree angle (not shown) between the section 226 and a section 227 may be used to match an exemplary $\phi_1$ degree angle of the second endplate 222 and first endplate 224. Likewise, other angular aspects are possible between the section 228 and the section 229. For example, an exemplary $\phi_2$ degree angle (not shown) between section 228 and the section 229 may be used to match an exemplary $\phi_2$ degree angle of the second endplate 222 and first endplate 224. In such an embodiment, when the first V-shaped door and the second V-shaped door are in a closed position, the base, the first V-shaped door, and the second V-shaped door form a sealed, water-resistant enclosure as is understandable from reading this document.

Hence, embodiments of the present invention enable easy access to modules located inside the electronics enclosure 212. In particular, this enables easier maintenance and installation of remote units in a distributed antenna system, such as the distributed antenna system 100 described in the '307 Application. In addition, the easy access is provided while maintaining and/or improving EMI shielding and the water-resistant seal of remote units as compared to conventional remote unit enclosures. Finally, enclosures 212 of the present invention reduce manufacturing costs by enabling the use of extrusion processes to manufacture the side walls and base as compared to conventional enclosures which use rigid components not conducive to extrusion processes as described in the '547 application.

Figure 8:
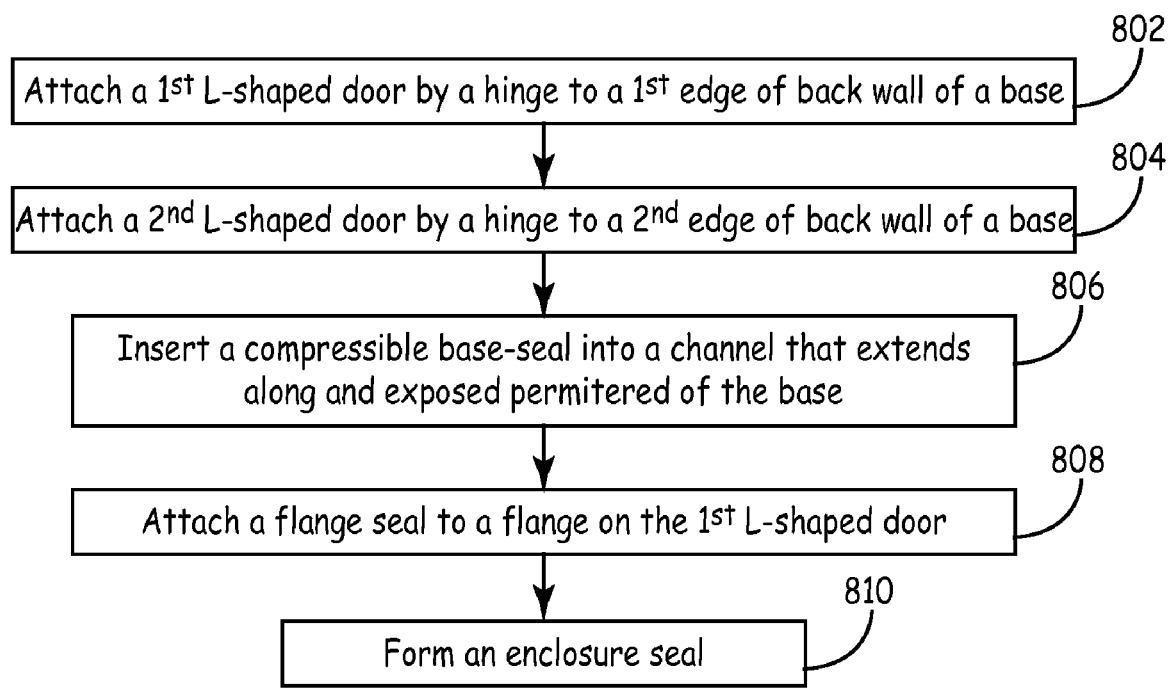
FIG. 8 is an embodiment of a method to seal an enclosure to prevent water from entering and to prevent electromagnetic radiation from leaving the enclosure in accordance with the present invention.

FIG. 8 is an embodiment of a method 800 to seal an enclosure to prevent water from entering and to prevent electromagnetic radiation from leaving the enclosure in accordance with the present invention. In one implementation of this embodiment, the enclosure is the enclosure 212 as described above with reference to FIGS. 1-9. The method 800 is described with reference to the enclosure 212 shown in FIG. 8 although it is to be understood that method 800 can be implemented using other embodiments of the enclosures as is understandable by one skilled in the art who reads this document.

At block 802, a first L-shaped door 216 is attached by a hinge 234 to a first edge, such as the first long edge 391, of back wall 220 of a base 214. At block 804, a second L-shaped door 218 is attached by a hinge 236 to a second edge, such as the second long edge 392, of back wall 220 of the base 214.

At block 806, a compressible base-seal 300 (FIG. 2) is inserted into a channel 230 that extends along an exposed perimeter 280 of the base 214 (FIG. 1). Specifically, the seamless compressible base-seal 300 is inserted into 1) the channel 230 at the edge 286 of the first endplate 224 of the base 214, 2) the channel 230 at edge 288 of the second endplate 222 of the base 244, and 3) the channel 230 at exposed perimeter 280 next to the first long edge 391 and the second long edge 392 of the back wall 220.

At block 808, a flange seal 320 (FIG. 3) is attached to a first flange 330 on the first L-shaped door 216 (FIG. 4). The rod portion 332 of the first flange 330 on the L-shaped door 216 is inserted into a cylindrical cavity 339 of the flange seal 320. In one implementation of this embodiment, the flange seal 320 is a trapezoidal seal 320.

At block 810, an enclosure seal 525 is formed with the first L-shaped door 216, the second L-shaped door 218, the compressible base-seal 230, and the flange seal 320. In order to form the enclosure seal 525, the first L-shaped door 216 is closed, the second L-shaped door 218 is closed, and the flange seal 320 is compressed between the first flange and an electronic module 550 in the enclosure 212. In one implementation of this embodiment, at least one hole 336(1-4) is deformed to fill a cavity 90' (FIG. 4) between the first flange 330 and the flange seal 320 and to fill a cavity 91 (FIG. 3) between the second flange 340 and the flange seal 320 when the flange seal 320 is compressed.

Figure 9B:
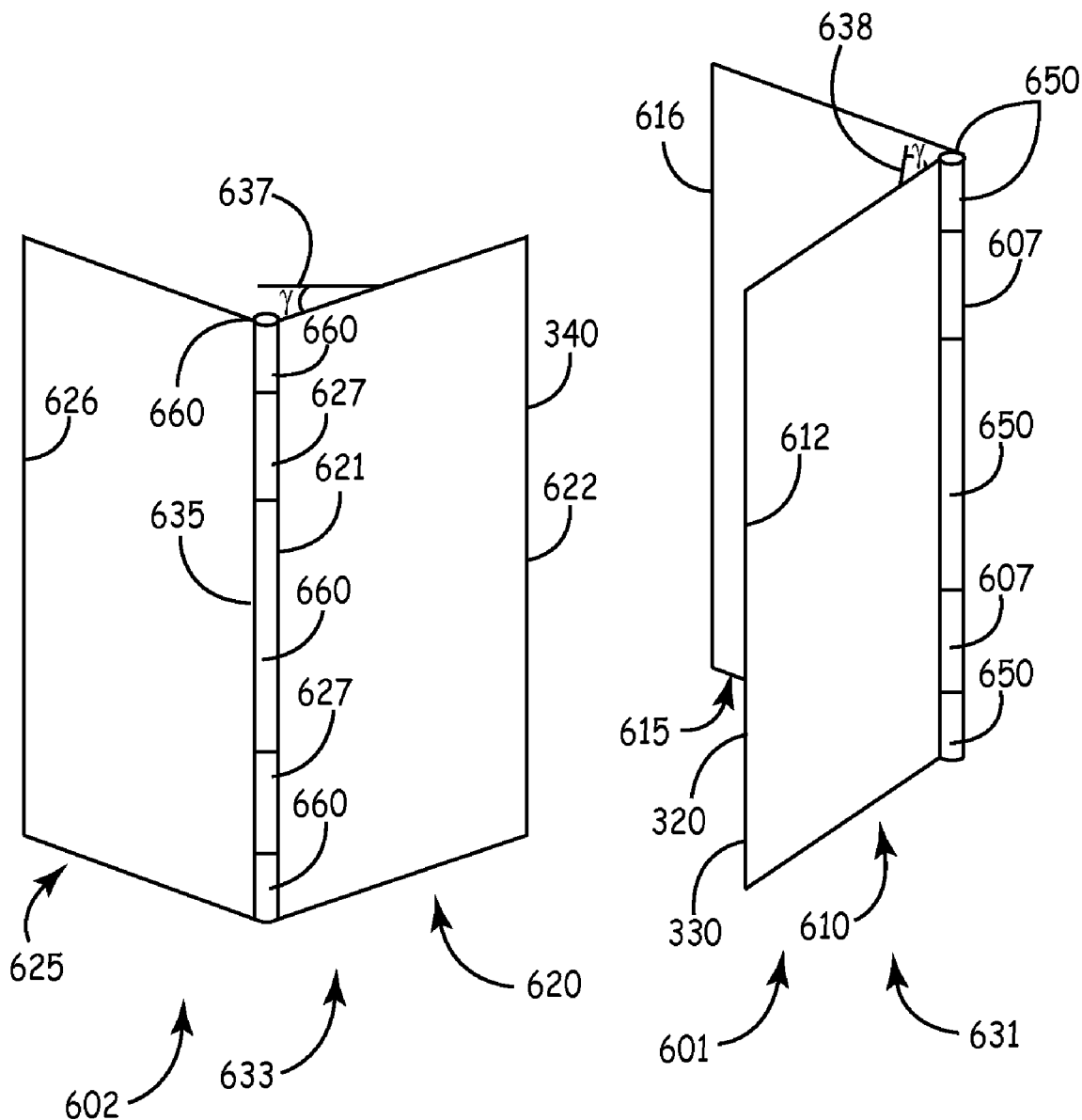

FIGS. 9A-9B show an embodiment of panels 610, 615, 620, and 625 for a first and a second configurable-door 601 and 602, in accordance with the present invention. The first configurable-shape door 601 can replace the first L-shaped door 216 in the previously described embodiments of this document. The second configurable-shape door 602 can replace the second L-shaped door 218 in the previously described embodiments of this document. As defined herein, a configurable-shape door is a door that can be configured as an L-shaped door by rotating panels from a flat-orientation to an L-shaped door orientation.

The first configurable-shape door 601 includes a first panel 610 and a second panel 615 that is rotatably attached by one or more hinges 607 to the first panel 610. The edge 611 of the first panel 610 is rotatably attached by hinges 607 to edge 617 of the second panel 615. The edge 612 includes a first flange 330 as described above with reference to FIGS. 3 and 6. A flange seal, such as trapezoidal seal 320 is attached to the first flange 330 as described above with reference to FIGS. 3 and 6. The first panel 610 includes an angled protrusion 638 that protrudes from the main surface 640 of the first panel 610 at an angle γ. The angled protrusion 638 is parallel to the edge 611 and extends for a length of (L−2ΔL), where L is the length L of the first panel 610. The angled protrusion 638 does not extend to the third edge 511 or the fourth edge 512 in order to leave a length ΔL for the panel 610 to lay flush against the edges 286 and 188 (FIG. 1) of the first and second endplates 224 and 222, respectively.

As shown in FIG. 9A, the first panel 610 and the second panel 615 are in a flat orientation and lie substantially in the plane of the main surface 640 of the first panel 610. When the first panel 610 is rotated about the hinges 607 in the direction indicated by the arrow 618 until the first panel 610 is perpendicular to the second panel 615, the first panel 610 and the second panel 615 form an L-shaped door 631 as shown in FIG. 9B.

The second configurable-shape door 602 includes a third panel 620 and a fourth panel 625 that is rotatably attached by one or more hinges 627 to the third panel 620. The edge 621 of the third panel 620 is rotatably attached by hinges 627 to edge 635 of the fourth panel 625. The edge 622 includes a second flange 340 as described above with reference to FIGS. 3 and 6. The third panel 620 includes an angled protrusion (hidden from view by the third panel 620) that is similar in structure and function to the angled protrusion 638 on the first panel 610. As shown in FIG. 9A, the third panel 620 and the fourth panel 625 are in a flat orientation and lie substantially in the plane of the main surface 641 of the third panel 620.

When the third panel 620 is rotated about the hinges 627 in the direction indicated by the arrow 619 until the third panel 620 is perpendicular to the fourth panel 625, the third panel 620 and the fourth panel 625 form an L-shaped door 631 as shown in FIG. 9B. As shown in FIG. 9B, the third panel 620 and the fourth panel 625 are in an L-shape-door orientation and the first panel 610 and the second panel 615 are in an L-shape-door orientation.

In embodiments of water-resistant and electromagnetic interference (EMI) shielded enclosures that include a first configurable-shape door 601 and a second configurable-shape door 602, the edge 616 of the second panel 615 is attached to the hinge 234 on the base 214 while the edge 626 is attached to the hinge 234 on the base 214 (FIG. 1). In order for enclosure to remain water-resistant and EMI shielded, a first hinge-compressible seal 650 is positioned between the edges 611 and 617 adjacent to the hinges 607 to seal the joint formed when the first configurable-shape door 601 is configured as an L-shaped door 631. Likewise, a second hinge-compressible seal 660 is positioned between the edges 621 and 635 adjacent to the hinges 627 to seal the joint formed when the second configurable-shape door 602 is configured as an L-shaped door 633. In one implementation of this embodiment, the hinges 607 and 627 are cam shaped hinges, such as the cam shaped hinges described in the '581 Application that is incorporated herein by reference. In another implementation of this embodiment, the first and second hinge-compressible seals 650 and 660 are trapezoidal seals similar to the trapezoidal seal 320 described above with reference to FIG. 3.

Figure 9C:
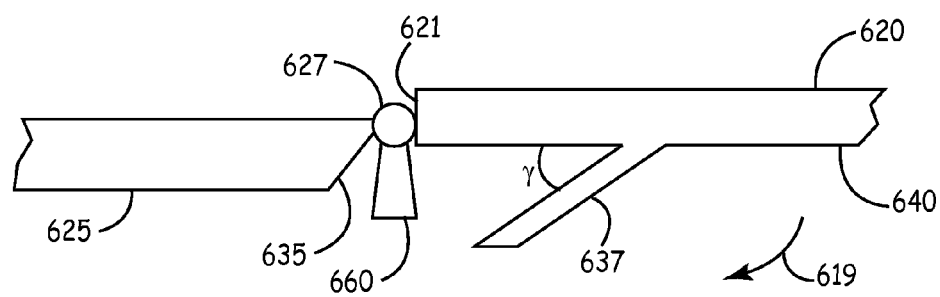
FIGS. 9C-9D show an enlarged top view of the hinged region between the panels of FIGS. 9A-9B, respectively.
Figure 9D:
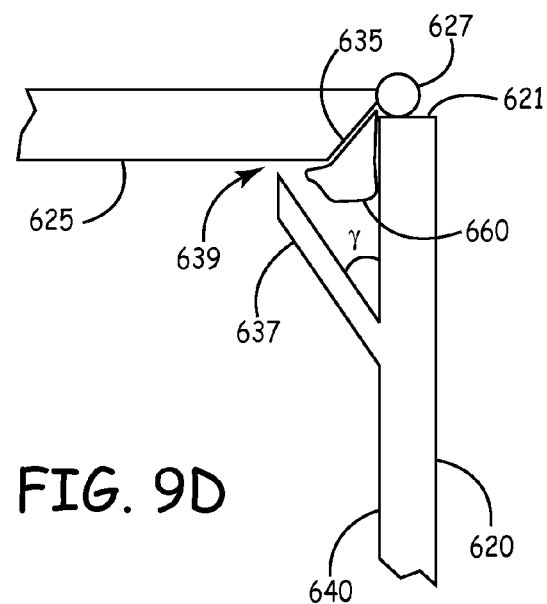

FIGS. 9C-9D show an enlarged top view of the hinged region between the panels 620 and 625 of FIG. 9B. FIG. 9C is a top view of the hinge 627 connected to the edge 621 of the third panel 620 and the edge 635 of the fourth panel 625 while the third panel 620 and the fourth panel 625 are in the flat orientation. The second hinge-compressible seal 660 is positioned between the edges 621 and 635 adjacent to the hinge 627. In this embodiment the edge 621 and edge 635 are not parallel to each other while in the flat orientation.

FIG. 9D is a top view of the hinge 627 connected to the edge 621 of the third panel 620 and the edge 635 of the fourth panel 625 while the third panel 620 and the fourth panel 625 are in the L-shape-door orientation. The second hinge-compressible seal 660 is compressed between the edges 621 and 635. Some of the second hinge-compressible seal 660 is pinched between the edges 621 and 635. In this orientation the angled protrusion 637 blocks any electromagnetic radiation, which travels in a straight path, from passing through the hinged region. In one implementation of this embodiment, the angled protrusion 637 touches the fourth panel 625 so that there is not gap 639. In such an implementation, the angled protrusion 637 is positioned on the third pane 620 so that the angled protrusion 637 touches the fourth panel 625 when the third panel 620 is perpendicular to the fourth panel 625.

Figure 10:
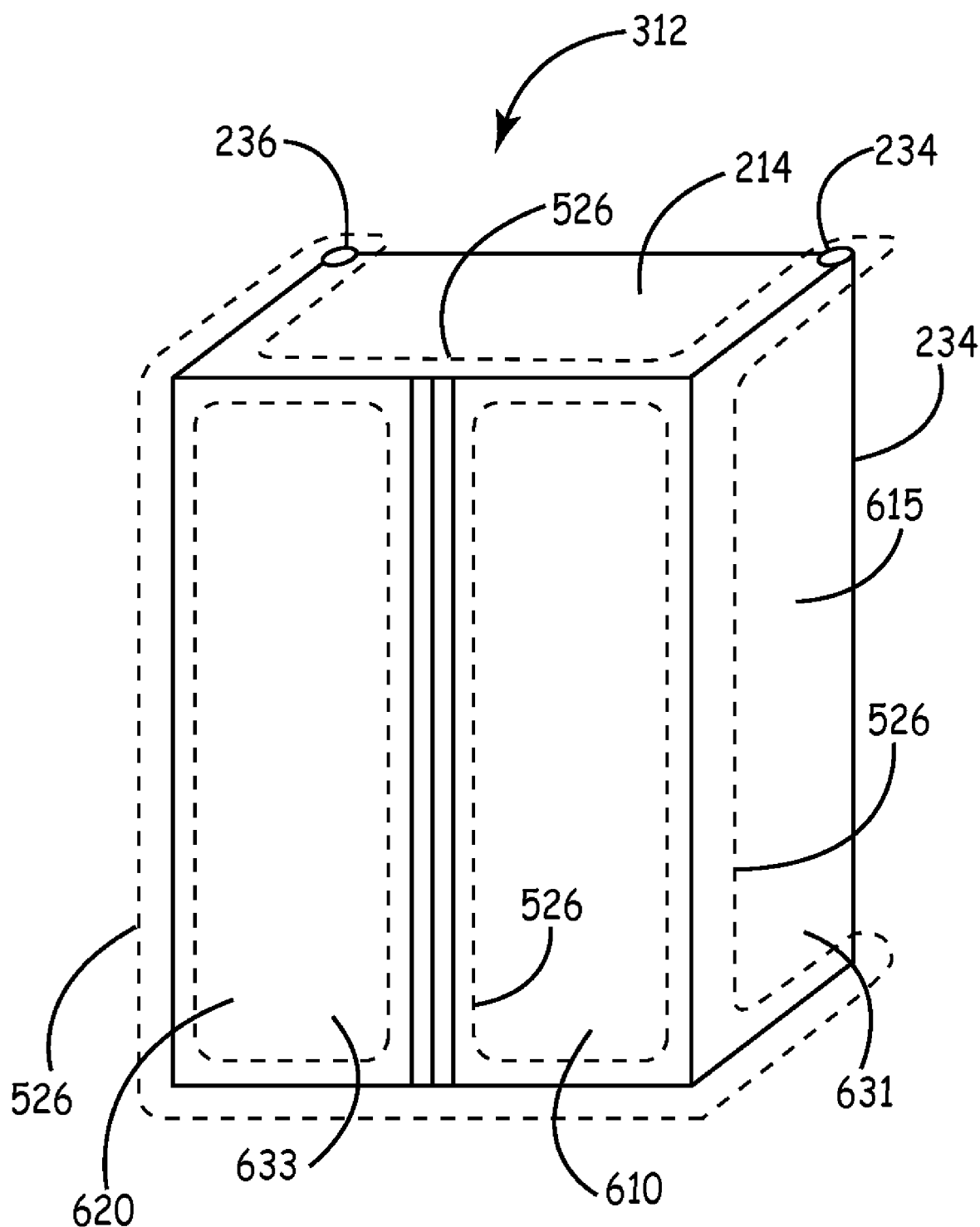
FIG. 10 is an oblique view of a water-resistant and electromagnetic interference shielded enclosure in a closed position.

FIG. 10 is an oblique view of a water-resistant and electromagnetic interference shielded enclosure 312 in a closed position. The water-resistant and electromagnetic interference shielded enclosure 312 (also referred to herein as enclosure 312) includes the first configurable-shape door 601 and the second configurable-shape door 602 of FIGS. 9A-9C that are attached to a base 214.

The first panel 610 and the second panel 615 are moved into a perpendicular position relative to each other and the second panel 615 is rotated about the hinge 234 so that the first panel 610 and the second panel 615 enclose about half of the base 214. Likewise, the third panel 620 and the fourth panel 625 are moved into a perpendicular position relative to each other and the fourth panel 625 is rotated about the hinge 236 so that the third panel 620 and the fourth panel 625 enclose the rest of the base 214. In this manner the first configurable-shape door 601 and the second configurable-shape door 602 enclose the base 214.

The first hinge-compressible seal 650 is compressed by the first panel 610 and the second panel 615 when the first panel is rotated perpendicular to the second panel. The second hinge-compressible seal 660 is compressed by the third panel 620 and the fourth panel 625 when the third panel 620 is rotated perpendicular to the fourth panel 625, so that the compressible base-seal 300, the trapezoidal seal 320, the first hinge-compressible seal 650, and the second hinge-compressible seal 660 form the enclosure seal 526 when the first panel 610 is rotated perpendicular to the second panel 615, the third panel 620 is rotated perpendicular to the fourth panel 625 (FIG. 9B), and the first panel 610, second panel 615, third panel 620, and fourth panel 625 enclose the base 214.

In this manner, an enclosure seal represented generally at 526, is formed when the first configurable-shape door 601 in the L-shape-door orientation, second configurable-shape door 602 in the L-shape-door orientation are rotated to enclose the base 214. The enclosure seal 526 functions to prevent moisture and electromagnetic fields from entering or leaving the water-resistant and electromagnetic interference shielded enclosure 212 when the enclosure 212 is in the closed configuration.

Figure 11:
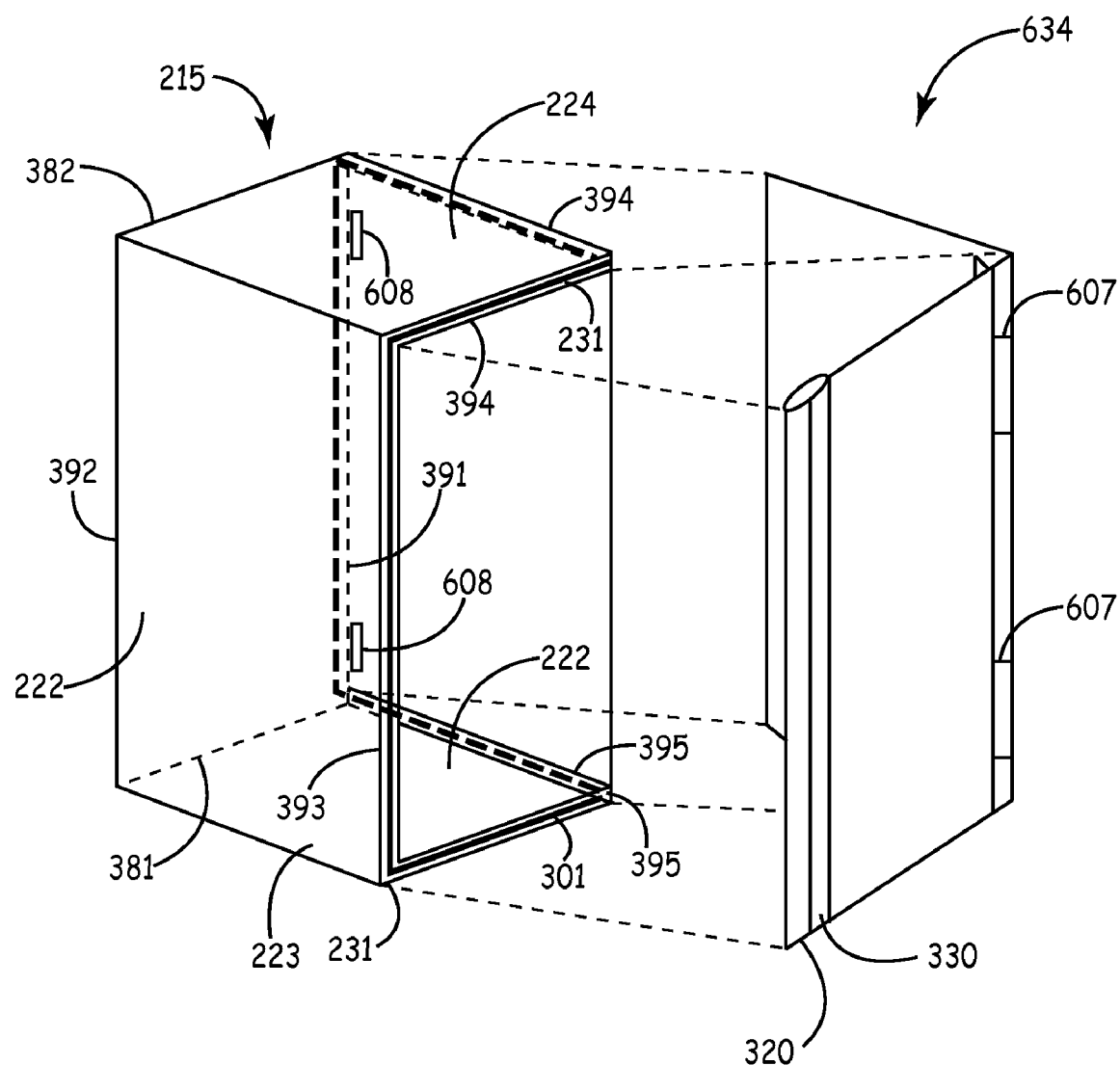
FIG. 11 is an exploded view of one embodiment of a configurable-shape door and a base in accordance with the present invention.
Figure 12:
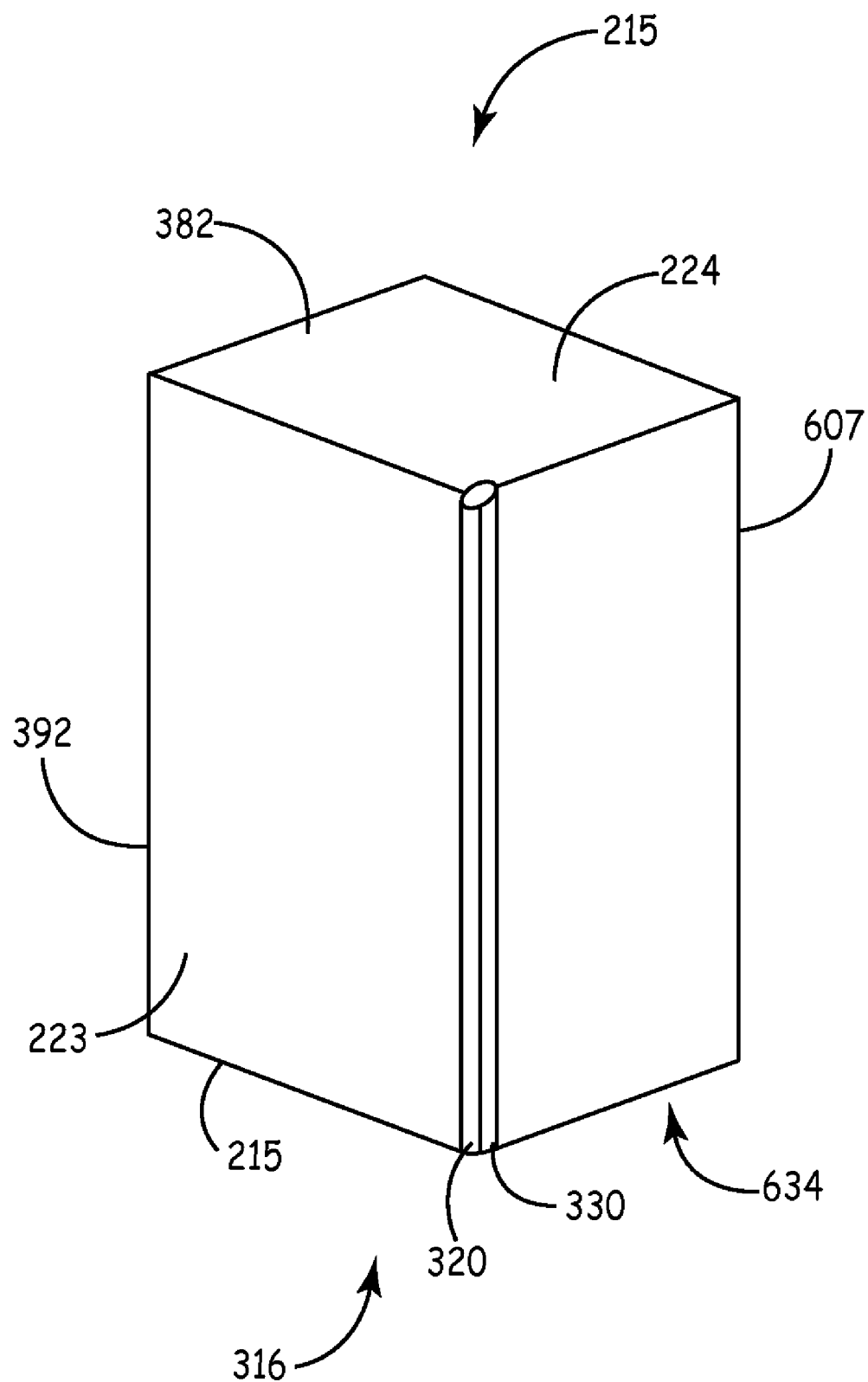
FIG. 12 is an oblique view of the configurable-shape door and the base of FIG. 11 in a closed position.

FIG. 11 is an exploded view of one embodiment of a configurable-shape door 634 and a base 215 in accordance with the present invention. FIG. 12 is an oblique view of the configurable-shape door 634 and the base 215 of FIG. 11 in a closed position. In this embodiment the base 215 includes the a back wall 220 having a first short edge 381, a second short edge 382 opposing the first short edge 381, a first long edge 391, and a second long edge 392 opposing the first long edge 391. A first endplate 224 is attached to the first short edge 381 of the back wall 220. A second endplate 222 is attached to the second short edge 382 of the back wall 220. A side wall 223 is attached to the second long edge 392. A portion of the channel 231 is located along the edge 393 of the side wall 223. In this embodiment, the continuous channel 231 is formed in the exposed edge 393 of the side wall 223, the exposed edge 391 of the back wall 220, and exposed edges 394 and 395 of the first and second endplates 224 and 222, respectively. A compressible base-seal 301 (shown as a bold line and a dashed line) is inserted into the continuous channel 231 in the base 215. The compressible base-seal 301 is similar in material and function to the compressible base-seal 300 as described above with reference to FIGS. 1 and 2.

The configurable-shape door 634 is similar in structure to the configurable-shape door 631 described above with reference to FIGS. 9A-9D. The configurable-shape door 634 is attached to the hinge 608 (FIG. 11) on the base 215, rotated to the L-shaped door configuration, and rotated to enclose the base 215. In this manner, a water-resistant and electromagnetic interference shielded enclosure 316 is formed as is understandable based on a reading of this document.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A water-resistant and electromagnetic interference shielded enclosure configured to enclose at least one electronic module, the enclosure comprising:
    a base having a channel;
    a first L-shaped door rotatably attached to a first edge of the base;
    a second L-shaped door rotatably attached to a second edge of the base;
    a flange seal attached to a first flange on the first L-shaped door, wherein the flange seal is a trapezoidal seal comprising;
        a cylindrical cavity on one surface of the trapezoidal seal to accept a rod portion of the first flange on the first L-shaped door;
        at least one hole extending a length of the trapezoidal seal; and
    a compressible base-seal inserted into the channel, wherein the compressible base-seal and the flange seal form an enclosure seal when the first L-shaped door and the second L-shaped door are closed, wherein when the first L-shaped door and the second L-shaped door are closed, the first flange of the first L-shaped door is positioned between a second flange on the second L-shaped door and the trapezoidal seal.

2. The enclosure of claim 1, trapezoidal seal further comprising
    a first acute angle subtended between a second surface and a third surface; and
    a second acute angle subtended between the third surface and a fourth surface.

3. The enclosure of claim 2, wherein the first acute angle equals the second acute angle.

4. The enclosure of claim 1, wherein the compressible base-seal comprises one of an O-ring, a C-shaped seal, a die cut foam, a solid piece having a circular cross section, a solid piece having a D-shaped cross section, a hollow piece having an annular cross section, a foam piece having a circular cross section, a foam piece having a D-shaped cross section, and a combination thereof.

5. The enclosure of claim 1, wherein the base comprises:
    a back wall having a first short edge, a second short edge opposing the first short edge, a first long edge, and a second long edge opposing the first long edge;
    a first endplate attached to the first short edge of the back wall; and
    a second endplate attached to the second short edge of the back wall, wherein the first edge of the base to which the first L-shaped door is rotatably attached is the first long edge, wherein the second edge of the base to which the second L-shaped door is rotatably attached is the second long edge, and wherein the channel is located along an exposed perimeter of the base.

6. The enclosure of claim 1, wherein the trapezoidal seal is compressed when both the first L-shaped door and the second L-shaped door are closed.

7. The enclosure of claim 1, wherein the first L-shaped door and the second L-shaped door are formed by an extrusion process.

8. The enclosure of claim 1, wherein the first L-shaped door is a first configurable-shape door, the first configurable-shape door including:
    a first panel;
    a second panel rotatably attached to the first panel, wherein the first panel and the second panel form an L-shaped door when the first panel is rotated perpendicular to the second panel;
    wherein the second L-shaped door is a second configurable-shape door, the second configurable-shape door including:
    a third panel;
    a fourth panel rotatably attached to the third panel, wherein the third panel and the fourth panel form an L-shaped when the third panel is rotated perpendicular to the fourth panel;
    the enclosure further comprising:
    a first hinge-compressible seal that is compressed by the first panel and the second panel when the first panel is rotated perpendicular to the second panel; and
    a second hinge-compressible seal that is compressed by the third panel and the fourth panel when the third panel is rotated perpendicular to the fourth panel, wherein the compressible base-seal, the flange seal, the first hinge-compressible seal, and the second hinge-compressible seal form the enclosure seal when the first panel is rotated perpendicular to the second panel, the third panel is rotated perpendicular to the fourth panel, and the first panel, second panel, third panel and fourth panel enclose the base.

9. A method to form a water resistant and electromagnetic interference shielded seal on an enclosure, the method comprising:
    attaching a first L-shaped door by a hinge to a first edge of a back wall of a base;
    attaching a second L-shaped door by a hinge to a second edge of the back wall of the base, the second edge opposing the first edge;
    inserting a compressible base-seal into a channel that extends along an exposed perimeter of the base;
    attaching a flange seal to a first flange on the first L-shaped door, wherein attaching the flange seal comprises inserting a rod portion of the first flange on the first L-shaped door into a cylindrical cavity of the flange seal; and
    forming an enclosure seal with the first L-shaped door, the second L-shaped door, the compressible base-seal, and the flange seal.

10. The method of claim 9, wherein the inserting comprises:
    inserting the compressible base-seal in the channel at an edge of a first endplate of the base;
    inserting the compressible base-seal in the channel at an edge of a second endplate of the base; and
    inserting the compressible base-seal in the channel at an exposed perimeter of the back wall.

11. The method of claim 9, wherein the forming an enclosure seal comprises:
    closing the first L-shaped door;
    closing the second L-shaped door responsive to closing the first L-shaped door; and
    compressing the flange seal between the first flange and an electronic module in the enclosure responsive to the closings.

12. The method of claim 11, wherein compressing the flange seal comprises;
    deforming at least one hole to fill a cavity between the first flange and the flange seal and to fill a cavity between a second flange and the flange seal.

13. The method of claim 9, wherein attaching the flange seal to the first flange comprises attaching a trapezoidal seal to the first flange.

14. A water-resistant and electromagnetic interference shielded enclosure configured to enclose at least one electronic module, the enclosure comprising:

a base having a channel that extends along an exposed perimeter of the base;

a first L-shaped door rotatably attached to a first edge of the base;

a second L-shaped door rotatably attached to a second edge of the base the second L-shaped door having a second flange;

a trapezoidal seal attached to a flange on the first L-shaped door; and a compressible base-seal inserted into the channel, wherein the compressible base-seal and the trapezoidal seal form an enclosure seal for the enclosure when the L-shaped door is closed, wherein when the first L-shaped door and the second L-shaped door are closed, the first flange is positioned between the second flange and the trapezoidal seal so that the compressible base-seal and the trapezoidal seal form the enclosure seal for the enclosure.

15. The enclosure of claim 14, wherein the base comprises:

a back wall having a first short edge, a second short edge opposing the first short edge, a first long edge, and a second long edge opposing the first long edge;

a first endplate attached to the first short edge of the back wall; and a second endplate attached to the second short edge of the back wall, wherein the channel is located along the edges of the base.

16. The enclosure of claim 14, wherein the first L-shaped door is a first configurable-shape door, the first configurable-shape door including:

a first panel; and a second panel rotatably attached to the first panel, wherein the first panel and the second panel form an L-shaped door when the first panel is rotated perpendicular to the second panel, and wherein the second L-shaped door is a second configurable-shape door, the second configurable-shape door including:

a third panel;

a fourth panel rotatably attached to the third panel, wherein the third panel and the fourth panel form an L-shaped when the third panel is rotated perpendicular to the fourth panel;

the enclosure further comprising:

a first hinge-compressible seal that is compressed by the first panel and the second panel when the first panel is rotated perpendicular to the second panel; and a second hinge-compressible seal that is compressed by the third panel and the fourth panel when the third panel is rotated perpendicular to the fourth panel, wherein the compressible base-seal, the trapezoidal seal, the first hinge-compressible seal, and the second hinge-compressible seal form the enclosure seal when the first panel is rotated perpendicular to the second panel, the third panel is rotated perpendicular to the fourth panel, and the first panel, second panel, third panel and fourth panel enclose the base.

* * * * *